(12) United States Patent
Saito et al.

(10) Patent No.: US 9,028,638 B2
(45) Date of Patent: May 12, 2015

(54) MULTILAYER ADHESIVE SHEET AND METHOD FOR MANUFACTURING ELECTRONIC COMPONENT

(75) Inventors: Takeshi Saito, Shibukawa (JP); Kazunori Shikano, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 197 days.

(21) Appl. No.: 13/805,749

(22) PCT Filed: Jul. 1, 2011

(86) PCT No.: PCT/JP2011/065149
§ 371 (c)(1),
(2), (4) Date: Dec. 20, 2012

(87) PCT Pub. No.: WO2012/008316
PCT Pub. Date: Jan. 19, 2012

(65) Prior Publication Data
US 2013/0092318 A1    Apr. 18, 2013

(30) Foreign Application Priority Data

Jul. 14, 2010 (JP) .............................. 2010-159799
Oct. 7, 2010 (JP) .............................. 2010-227361

(51) Int. Cl.

| | |
|---|---|
| *C09J 175/04* | (2006.01) |
| *C09J 143/04* | (2006.01) |
| *C09J 11/06* | (2006.01) |
| *H01L 21/02* | (2006.01) |
| *H01L 21/683* | (2006.01) |
| *H01L 21/78* | (2006.01) |
| *H01L 23/00* | (2006.01) |
| *C09J 7/02* | (2006.01) |
| *C08G 18/67* | (2006.01) |
| *C08G 18/79* | (2006.01) |
| *C08G 18/80* | (2006.01) |
| *C09D 4/06* | (2006.01) |
| *C08F 220/18* | (2006.01) |
| *C08F 265/04* | (2006.01) |
| *C08F 290/14* | (2006.01) |
| *C09J 151/00* | (2006.01) |
| *C08F 222/10* | (2006.01) |
| *C08L 75/14* | (2006.01) |
| *C08G 77/442* | (2006.01) |

(52) U.S. Cl.
CPC .............. *H01L 21/78* (2013.01); *Y10T 428/14* (2015.01); *Y10T 156/1052* (2015.01); *H01L 21/6836* (2013.01); *H01L 24/27* (2013.01); *H01L 24/29* (2013.01); *H01L 24/83* (2013.01); *H01L 2224/274* (2013.01); *H01L 2224/27436* (2013.01); *H01L 2224/83191* (2013.01); *H01L 2224/838* (2013.01); *H01L 2924/01004* (2013.01); *H01L 2924/01025* (2013.01); *H01L 2924/01082* (2013.01); *H01L 2924/10253* (2013.01); *C08F 222/1006* (2013.01); *C08L 75/14* (2013.01); *H01L 2224/29* (2013.01); *H01L 2224/2919* (2013.01); *H01L 2924/01005* (2013.01); *H01L 2924/01006* (2013.01); *H01L 2924/01033* (2013.01); *H01L 2924/0665* (2013.01); *C09J 7/02* (2013.01); *C08G 18/673* (2013.01); *C08G 18/792* (2013.01); *C08G 18/8029* (2013.01); *C09J 7/0246* (2013.01); *C09J 7/0275* (2013.01); *C09J 2203/326* (2013.01); *C09J 2205/114* (2013.01); *C09J 2423/006* (2013.01); *C09J 2433/00* (2013.01); *H01L 2224/29299* (2013.01); *H01L 2224/2929* (2013.01); *C08G 77/442* (2013.01); *H01L 2924/00013* (2013.01); *C09D 4/06* (2013.01); *C08F 220/18* (2013.01); *C08F 2222/104* (2013.01); *C08F 2222/1086* (2013.01); *C08F 265/04* (2013.01); *C08F 290/14* (2013.01); *C09J 151/003* (2013.01)

(58) Field of Classification Search
CPC ........ C09J 175/04; C09J 143/04; C09J 11/06; H01L 21/02; H01L 21/683; H01L 21/67132; C08G 18/6229; C08G 18/8029; C08G 18/8175
See application file for complete search history.

(56) References Cited

U.S. PATENT DOCUMENTS

| 5,238,876 A * | 8/1993 | Takeuchi et al. ............... 438/464 |
| 2006/0188725 A1 | 8/2006 | Yoshida et al. |
| 2010/0248452 A1 * | 9/2010 | Saito et al. ..................... 438/464 |

FOREIGN PATENT DOCUMENTS

| JP | 2006-049509 A | 2/2006 |
| JP | 2006-264296 A | 10/2006 |
| JP | 2007-246633 A | 9/2007 |
| JP | 2008-001817 A | 1/2008 |

OTHER PUBLICATIONS

International Search Report and English Translation of PCT/JP2011/065149 mailed on Oct. 4, 2011.

* cited by examiner

*Primary Examiner* — Linda L Gray
(74) *Attorney, Agent, or Firm* — Roberts Mlotkowski Safran & Cole P.C.

(57) ABSTRACT

Provided is a multilayer adhesive sheet which enables easy separation between an adhesive layer and a die attach film during the pick-up even in cases where an acrylate ester copolymer is used in the die attach film, thereby making the pick-up work of semiconductor chips after the dicing easy. The multilayer adhesive sheet comprises a base film, an adhesive layer that is disposed on one surface of the base film, and a die attach film that is disposed on an exposed surface of the adhesive layer. The adhesive that constitutes the adhesive layer contains: (A) a (meth)acrylate ester copolymer; (B) an ultraviolet polymerizable compound; (C) a multifunctional isocyanate curing agent; (D) a photopolymerization initiator; and (E) a silicone polymer.

4 Claims, No Drawings ded sheet) having both a function of the adhesive sheet for
MULTILAYER ADHESIVE SHEET AND METHOD FOR MANUFACTURING ELECTRONIC COMPONENT

TECHNICAL FIELD

The present invention relates to a multilayer adhesive sheet and a method for manufacturing electronic components by using the multilayer adhesive sheet.

BACKGROUND ART

A method of preparing an integrated electronic component by forming a circuit pattern on a semiconductor wafer for example of silicon or gallium-arsenic, bonding the integrated electronic component to an adhesive sheet having a base film layer and an adhesive layer, fixing it additionally to a ring frame, cutting (dicing) it into separate semiconductor chips, expanding the film as needed, picking up the semiconductor chips, and fixing the semiconductor chips for example onto a lead frame with an adhesive is practiced widely in manufacture of electronic components such as ICs.

In such a manufacturing method, proposed were methods of using a multilayer adhesive sheet (die attach film-integrated sheet) having both a function of the adhesive sheet for dicing and a function of the adhesive for fixing the chips for example to lead frame, which is prepared by integrating the die attach film with the adhesive sheet by lamination (see Patent Documents 1 and 2). Use of the die attach film-integrated sheet in manufacture of electronic components gives an advantage that it is possible to eliminate the adhesive-coating step and control the thickness of the adhesive region and suppress exudation thereof, compared to the method of using an adhesive.

CITATION LIST

Patent Documents

[Patent Document 1] Japanese Unexamined Patent Application Publication No. 2006-049509
[Patent Document 2] Japanese Unexamined Patent Application Publication No. 2007-246633

SUMMARY OF INVENTION

Technical Problem

Normally, common adhesive materials such as acrylic, epoxy, and polyamide resins are used for the die attach film of multilayer adhesive sheets. In particular, acrylic ester copolymers, when used as the material constituting the die attach film, permits improvement in storage stability and film-forming property. However, die attach films containing an acrylic ester copolymer have excessively stronger bonding strength to the adhesive layer of the adhesive sheet, making the die attach film less easily separated from the adhesive layer during pick up of semiconductor chips and thus, occasionally leading to deterioration in the pick-up efficiency of the semiconductor chips.

In the present invention, which was made under the circumstances above, it was found that it is possible, by making the adhesive that constitutes the adhesive layer of multilayer adhesive sheet have a particular composition, to easily separate the die attach film and the adhesive layer during pick up and to easily pick up the semiconductor chips obtained after dicing, even if an acrylic ester copolymer is used for the die attach film, and achieved the present invention.

Solution to Problem

Accordingly, the present invention relates to the following multilayer adhesive sheet and method for manufacturing electronic components by using the multilayer adhesive sheet.

(1) A multilayer adhesive sheet, comprising a base film, an adhesive layer that is disposed on one surface of the base film, and a die attach film that is disposed on the exposed surface of the adhesive layer, the adhesive that constitutes the adhesive layer containing (A) a (meth)acrylic ester copolymer, (B) an ultraviolet polymerizable compound, (C) a multifunctional isocyanate curing agent, (D) a photopolymerization initiator, and (E) a silicone polymer, wherein: the (meth) acrylic ester copolymer (A) is a copolymer of (meth) acrylic ester monomers or a copolymer of (meth)acrylic ester monomers and vinyl compound monomers, the (meth)acrylic ester monomers and the vinyl compound monomers having no hydroxyl group; the ultraviolet polymerizable compound (B) comprises a urethane acrylate oligomer (B1) and a multifunctional (meth)acrylate (B2), the urethane acrylate oligomer (B1) containing 10 or more vinyl groups and having a weight-average molecular weight Mw of 50000 or more and a polydispersity Mw/Mn, a ratio of the weight-average molecular weight Mw to the number-average molecular weight Mn, of 5 or more; the photopolymerization initiator (D) has a hydroxyl group; the silicone polymer (E) has a hydroxyl group; and the adhesive that constitutes the adhesive layer contains 100 parts by mass of the (meth)acrylic ester copolymer (A), 5 to 200 parts by mass of the ultraviolet polymerizable compound (B), 0.5 to 20 parts by mass of the multifunctional isocyanate curing agent (C), 0.1 to 20 parts by mass of the photopolymerization initiator (D), and 0.1 to 20 parts by mass of the silicone polymer (E).

(2) The multilayer adhesive sheet according to (1), wherein: the urethane acrylate oligomer (B1) is a reaction product obtained by reacting a hydroxyl group-containing acrylate containing dipentaerythritol pentaacrylate as the principal component with an isocyanate of isophorone diisocyanate trimer; and the multifunctional (meth)acrylate (B2) is dipentaerythritol hexaacrylate.

(3) The multilayer adhesive sheet according to (1) or (2), wherein the composition constituting the die attach film contains an acrylic ester copolymer.

(4) A method for manufacturing electronic components, comprising: a bonding step of bonding and fixing a multilayer adhesive sheet according to any one of (1) to (3) to a silicon wafer and a ring frame; a dicing step of dicing the silicon wafer into semiconductor chips with a dicing blade; and a pick-up step of irradiating the semiconductor chips at least with ultraviolet ray or radiation ray and picking up the chips and the die attach films from the adhesive layer.

Advantageous Effects of Invention

According to the multilayer adhesive sheet of the present invention, it is possible to easily separate the die attach film and the adhesive sheet during pick up and to easily pick up the chips obtained after dicing, even if an acrylic ester copolymer is used for the die attach film.

The multilayer adhesive sheet of the present invention is superior in chip pick-up efficiency, and additionally, causes fewer chip flying during dicing (higher chip-holding efficiency) and is resistant to stain of the die attach film by the components derived from the adhesive layer (stain resistance) and thus, can be used favorably in manufacture of electronic components.

DESCRIPTION OF EMBODIMENTS

<Definition of Terms>

The "monomer unit", as used herein, is a structural unit derived from monomer. "Part" and "%" are values based on mass. A (meth)acrylate is a generic term including an acrylate and a methacrylate. (Meth)-containing compounds, such as (meth)acrylic acid, are also similar generic terms indicating containing or not containing "meth" in the name.

[Multilayer Adhesive Sheet]

The multilayer adhesive sheet has a base film, an adhesive layer disposed on one surface of the base film, and a die attach film disposed on the exposed surface of the adhesive layer. Thus, the multilayer adhesive sheet is a multilayer structure comprising a base film, an adhesive layer, and a die attach film that are formed in that order. In the present description, the laminate of the base film and the adhesive layer only will be referred to as "adhesive sheet," and the laminate of the adhesive sheet additionally with the die attach film as "multilayer adhesive sheet."

<Base Film>

The base film is not particularly limited and can be prepared from a known resin material. Specific examples thereof include polyvinyl chloride, polyethylene terephthalate, ethylene-vinyl acetate copolymers, ethylene-acrylic acid-acrylic ester films, ethylene-ethyl acrylate copolymers, polyethylene, polypropylene, propylene-based copolymers, ethylene-acrylic acid copolymers, and, ethylene-(meth)acrylic acid copolymers, ionomer resins such as ethylene-(meth)acrylic acid -(meth)acrylic ester copolymers crosslinked with metal ions, and the like. The base film may be prepared from a mixture or a copolymer of these resins or may be a laminate of these resins.

In particular, the base film is preferably made of a propylene-based copolymer. It is possible by using a propylene-based copolymer to reduce the amount of the debris generated during semiconductor wafer cutting. The propylene-based copolymer is, for example, a random copolymer of propylene with other components, a block copolymer of propylene with other components, or an alternating copolymer of propylene with other components. Examples of the other components include α-olefins such as ethylene, 1-butene, 1-pentene, 1-hexene, and 1-heptene, copolymers of at least two or more α-olefins, styrene-diene copolymers, and the like. 1-Butene is particularly preferable among them.

The propylene-based copolymer may be prepared, for example, by solution polymerization method, bulk polymerization method, gas-phase polymerization method, stepwise polymerization method, or the like, but preferable is a stepwise polymerization method of at least two stages, wherein a propylene homopolymer or a random copolymer of propylene with small amounts of ethylene and/or α-olefin is prepared in the first stage and an α-olefinic homopolymer or a random copolymer of propylene with small amounts of ethylene and /or α-olefin is prepared in the second and later stages.

The base film is preferably subjected to antistatic treatment. It is possible by the antistatic treatment to prevent static electrification during separation of the die attach film. Examples of the antistatic treatments include (1) those of blending an antistatic agent to the composition constituting the base film, (2) those of coating an antistatic agent on a surface of the base film on which the die attach film is disposed, and (3) those by corona discharge. The antistatic agent is, for example, a quaternary amine salt monomer.

Examples of the quaternary amine salt monomers include quaternized dimethylaminoethyl (meth)acrylate chloride salts, quaternized diethylaminoethyl (meth)acrylate chloride salts, quaternized methylethylaminoethyl (meth)acrylate chloride salts, quaternized p-dimethylaminostyrene chloride salts, and quaternized p-diethylamino styrene chloride salts. And preferable are quaternized dimethylaminoethyl methacrylate chloride salts.

<Adhesive>

The adhesive layer comprises an adhesive, and the adhesive contains a (meth)acrylic ester copolymer (A), an ultraviolet polymerizable compound (B), a multifunctional isocyanate curing agent (C), a photopolymerization initiator (D), and a silicone polymer (E).

[(Meth)acrylic Ester Polymer (A)]

The (meth)acrylic ester copolymer is a copolymer only of (meth)acrylic ester monomers or a copolymer of (meth)acrylic ester monomers with vinyl compound monomers, wherein these monomers do not have hydroxyl groups.

Examples of the (meth)acrylic ester monomers include butyl (meth)acrylate, 2-butyl (meth)acrylate, t-butyl (meth)acrylate, pentyl (meth)acrylate, octyl (meth)acrylate, 2-ethylhexyl (meth)acrylate, nonyl (meth)acrylate, decyl (meth)acrylate, lauryl (meth)acrylate, methyl (meth)acrylate, ethyl (meth)acrylate, isopropyl (meth)acrylate, tridecyl (meth)acrylate, myristyl (meth)acrylate, cetyl (meth)acrylate, stearyl (meth)acrylate, cyclohexyl (meth)acrylate, isobornyl (meth)acrylate, dicyclopentanyl (meth)acrylate, benzyl (meth)acrylate, methoxyethyl (meth)acrylate, ethoxyethyl (meth)acrylate, butoxymethyl (meth)acrylate, and ethoxy-n-propyl (meth)acrylate.

Examples of the vinyl compound monomers include monomers containing one or more functional groups selected from the functional groups consisting of carboxyl, epoxy, amide, amino, methylol, sulfonic acid, sulfamic acid, and phosphoric/phosphorous acid ester groups.

Examples of the vinyl compound monomers having a carboxyl group include (meth)acrylic acid, crotonic acid, maleic acid, maleic anhydride, itaconic acid, fumaric acid, acrylamido N-glycolic acid, cinnamic acid, and the like.

Examples of the vinyl compound monomers having an epoxy group include allyl glycidyl ether and (meth)acrylic acid glycidyl ether.

The amide group-containing vinyl compound monomer is, for example, (meth)acrylamide.

The amino group-containing vinyl compound monomer is, for example, N,N-dimethylaminoethyl (meth)acrylate.

The methylol group-containing vinyl compound monomer is, for example, N-methylolacrylamide.

The (meth)acrylic ester copolymer is prepared, for example, by emulsion polymerization or solution polymerization. In particular, emulsion polymerization is preferable, as the adhesive sheet is easily separated from the die attach film after irradiation with radiation ray, assuring high pick-up efficiency of semiconductor chips.

(Ultraviolet Polymerizable Compound (B))

The ultraviolet polymerizable compound (B) is a mixture of a urethane acrylate oligomer (B1) and a multifunctional (meth)acrylate (B2). The blending rate B1:B2 of the urethane acrylate oligomer (B1) to the multifunctional (meth)acrylate (B2) is preferably 50:50 or more and 95:5 or less, more preferably 65:35 or more and 85:15 or less.

(Urethane Acrylate Oligomer (B1))

The urethane acrylate oligomer (B1) is an oligomer containing 10 or more vinyl groups and having a weight-average molecular weight Mw of 50000 or more and a polydispersity Mw/Mn, i.e., the ratio of the weight-average molecular weight Mw to the number-average molecular weight Mn, of 5 or more.

Examples of the urethane acrylate oligomers (B1) include (1) those prepared by reacting a (meth)acrylate compound having a hydroxyl group and multiple (meth)acrylate groups with a compound having multiple isocyanate groups (for example, diisocyanate compound), and (2) those prepared by reacting a polyol oligomer having multiple hydroxyl group terminals with an excess amount of a compound having multiple isocyanate groups (for example, diisocyanate compound) to form an oligomer having multiple isocyanate terminals and additionally reacting a (meth)acrylate compound having a hydroxyl group and multiple (meth)acrylate groups therewith.

When the urethane acrylate oligomer (B1) has 10 or more vinyl groups, the adhesive sheet is easily separated from the die attach film after irradiation with radiation ray, thus assuring high pick-up efficiency of semiconductor chips.

Alternatively when the urethane acrylate oligomer (B1) has a weight-average molecular weight Mw of 50000 or more and a polydispersity Mw/Mn, i.e., the ratio of the weight-average molecular weight Mw to the number-average molecular weight Mn, of 5 or more, the adhesive sheet can be separated easily from the die attach film after irradiation, as the bonding strength between the adhesive sheet and the die attach film decreases.

Examples of the (meth)acrylate compounds having a hydroxyl group and multiple (meth)acrylate groups constituting the urethane acrylate oligomer (B1), include hydroxypropylated trimethylolpropane triacrylate, pentaerythritol triacrylate, dipentaerythritol-hydroxy pentaacrylate, bis(pentaerythritol) tetraacrylate, tetramethylol methane triacrylate, glycidol diacrylate, and the homologs thereof in which part or all of the acrylate groups are replaced with methacrylate groups.

Examples of the compounds having multiple isocyanate groups constituting the urethane acrylate oligomer (B1) include aromatic isocyanates, cycloaliphatic isocyanates, and aliphatic isocyanates. Preferable among these isocyanates are alicyclic and aliphatic isocyanates having multiple isocyanate groups. The isocyanate component may be a monomer, a dimer, or a trimer in its shape, and a trimer is preferable.

Examples of the aromatic diisocyanates include tolylene diisocyanate, 4,4-diphenylmethane diisocyanate, and xylylene diisocyanate.

Examples of the alicyclic diisocyanates include isophorone diisocyanate and methylenebis(4-cyclohexylisocyanate).

Examples of the aliphatic diisocyanate include hexamethylene diisocyanate and trimethylhexamethylene diisocyanate.

Examples of the polyol components for the polyol oligomer having multiple hydroxyl group terminals constituting the urethane acrylate oligomer (B1) include poly(propylene oxide)diol, poly(propylene oxide)triol, copolymeric (ethyleneoxide-propyleneoxide)diol, poly(tetramethyleneoxide) diol, ethoxylated bisphenol A's, ethoxylated bisphenol S spiro glycols, caprolactone-modified diols, and carbonate diols.

(Multifunctional (meth)acrylate (B2))

Examples of the multifunctional (meth)acrylates (B2) include trimethylolpropane triacrylate, hydroxypropylated trimethylolpropane triacrylates, pentaerythritol triacrylate, pentaerythritol tetraacrylate, pentaerythritol triacrylate, pentaerythritol ethoxy tetraacrylate, dipentaerythritol hydroxy pentaacrylate, dipentaerythritol hexaacrylate, bis(pentaerythritol) tetraacrylate, tetramethylol methane triacrylate, glycidol-diacrylate, and the homologs thereof in which part or all of the acrylate groups are replaced with methacrylate groups.

The blending rate of the ultraviolet polymerizable compound (B) is preferably 5 parts by mass or more and 200 parts by mass or less with respect to 100 parts by mass of the (meth)acrylic ester copolymer (A). When the blending amount of the ultraviolet polymerizable compound (B) is too low, the adhesive sheet cannot be separated easily from the die attach film after irradiation with radiation ray, leading to the problems of low pick-up efficiency of semiconductor chips. Alternatively when the blending amount of the ultraviolet polymerizable compound (B) is too much, there are more frequent pick-up defects generated by incorporation of the paste during dicing and more stain of the die attach film by fine paste residues by reaction residue, leading to facile generation of bonding defects when semiconductor chips carrying the die attach film bonded thereto are adhered to a lead frame and heated thereon.

[Multifunctional Isocyanate Curing Agent (C)]

The multifunctional isocyanate curing agent (C) is a curing agent having two or more isocyanate groups, and examples thereof include aromatic polyisocyanates, aliphatic polyisocyanates, and alicyclic polyisocyanates.

Examples of the aromatic polyisocyanates include 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, 2,4,6-triisocyanatotoluene, 1,3,5-triisocyanatobenzene, dianisidine diisocyanate, 4,4'-diphenylether diisocyanate, 4,4',4"-triphenylmethane triisocyanate, ω,ω'-diisocyanato-1,3-dimethylbenzene, ω,ω'-diisocyanato-1,4-dimethylbenzene, ω,ω'-diisocyanato-1,4-diethylbenzene, 1,4-tetramethylxylylene diisocyanate, and 1,3-tetramethylxylylene diisocyanate.

Examples of the aliphatic polyisocyanates include trimethylene diisocyanate, tetramethylene diisocyanate, hexamethylene diisocyanate, pentamethylene diisocyanate, 1,2-propylene diisocyanate, 2,3-butylene diisocyanate, 1,3-butylene diisocyanate, dodecamethylene diisocyanate, and 2,4,4-trimethylhexamethylene diisocyanate.

Examples of the alicyclic polyisocyanates include 3-isocyanatomethyl-3,5,5-trimethylcyclohexyl isocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylene bis(cyclohexyl isocyanate), 1,4-bis(isocyanatomethyl)cyclohexane, and 1,4-bis(isocyanatomethyl)cyclohexane.

Preferable among the polyisocyanates described above are 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, and hexamethylene diisocyanate.

The blending rate of the multifunctional isocyanate curing agent (C) is preferably 0.5 part by mass or more and 20 parts by mass or less with respect to 100 parts by mass of the (meth)acrylic ester copolymer (A), and more preferably, the lower limit is 1.0 part by mass or more and the upper limit 10 parts by mass or less. It is possible, when the content of the multifunctional isocyanate curing agent (C) is 0.5 part or more by mass, to reduce generation of pick-up defects, as the bonding strength is not excessively high. It is possible, when the content of the multifunctional isocyanate curing agent (C) is 20 parts by mass or less, to hold the semiconductor chips reliably during dicing, as the bonding strength is not excessively low.

[Photopolymerization Initiator (D)]

The photopolymerization initiator (D) is a compound having at least one hydroxyl group. Examples of the photopolymerization initiators having one hydroxyl group include 2-hydroxy-methyl-1-phenyl-propan-1-one (produced by Ciba Japan K.K., product name: Darocur 1173), 1-hydroxy-cyclohexyl-phenyl-ketone (produced by Ciba Japan K.K., product name: Irgacure 184) and the like, and examples of the photopolymerization initiators having two or more hydroxyl groups include 1-[4-(hydroxyethoxy)-phenyl]-2-hydroxy-2-methyl-1-propan-1-one (produced by Ciba Japan K.K., product name: Irgacure 2959), 2-hydroxy-1-(4-[4-(2-hydroxy-2-methyl-propionyl)-benzyl]-phenyl)-2-methyl-propan-1-one (produced by Ciba Japan K.K., product name: Irgacure 127), and the like. The number of the hydroxyl groups in the photopolymerization initiator (B) having hydroxyl groups is preferably two or more. When there are two or more hydroxyl groups, the photopolymerization initiator cleaved after irradiation with radiation ray is incorporated into the reaction system of the acryloyl group in the (meth)acrylic ester monomer (A), inhibiting migration thereof into the die attach film. The maximum number of the hydroxyl groups is not particularly limited.

The blending amount of the photopolymerization initiator (D) is preferably 0.1 part by mass or more and 20 parts by mass or less with respect to 100 parts by mass of the (meth) acrylic ester polymer (A). When the blending amount is excessively low, the adhesive sheet cannot be separated easily from the die attach film after irradiation with radiation ray, leading to deterioration in the pick-up efficiency of semiconductor chips. Alternatively when the rate is too high, it is not possible to suppress stain on the adhesive layer surface by bleeding out, leading to facile generation of bonding defects, when semiconductor chips carrying the die attach film bonded thereto are mounted on a lead frame and heated.

[Silicone Polymer (E)]

The silicone polymer (E) favorably blended to the adhesive is a silicone polymer having a monomer unit derived from a monomer having vinyl groups at the polydimethylsiloxane chain terminals (hereinafter, referred to as a "silicone-based macromonomer"). Specifically, it is a homopolymer of a silicone-based macromonomer or a vinyl polymer prepared by polymerizing a silicone-based macromonomer with other vinyl compounds. The silicone-based macromonomer is preferably a compound with polydimethylsiloxane chain that is bound to vinyl groups such as (meth)acryloyl or styryl groups at the terminals.

(Meth)acrylic monomers can be used as the vinyl compounds, other than the silicone-based macromonomer, constituting the silicone polymer (E). It is possible by using such a silicone polymer to prevent migration of the silicone polymer into the die attach film when the adhesive sheet and the die attach film are laminated and also to prevent generation of fine paste residues called particles when semiconductor chips are picked up. Examples of the (meth)acrylic monomers include alkyl (meth)acrylates, hydroxyalkyl (meth)acrylates, modified hydroxy (meth)acrylate, and (meth)acrylic acid.

Examples of the alkyl (meth)acrylates include methyl (meth)acrylate, ethyl (meth) acrylate, n-propyl (meth) acrylate, n-butyl (meth) acrylate, isobutyl (meth) acrylate, t-butyl (meth) acrylate, 2-ethylhexyl (meth) acrylate, lauryl (meth) acrylate, stearyl (meth)acrylate, isobornyl (meth)acrylate, and hydroxyalkyl (meth)acrylates.

Examples of the hydroxyalkyl (meth)acrylates include hydroxyethyl (meth)acrylate, hydroxypropyl (meth)acrylate, and hydroxybutyl (meth)acrylate.

Examples of the modified hydroxy (meth)acrylates include ethyleneoxide-modified hydroxy (meth)acrylates and lactone-modified hydroxy (meth)acrylates.

The blending amount of the silicone polymer (E) is preferably, 0.1 part by mass or more and 20 parts by mass or less with respect to 100 parts by mass of the (meth)acrylic ester polymer (A). When the blending amount is excessively small, the adhesive sheet cannot be separated easily from the die attach film after irradiation with radiation ray, leading to deterioration in the pick-up efficiency of semiconductor chips. Alternatively when the blending amount is excessively large, it is not possible to suppress deterioration in initial adhesive power, making it difficult to hold semiconductor chips during dicing.

The rate of the silicone-based macromonomer unit in the silicone polymer (E) is preferably 15 parts by mass or more and 50 parts by mass or less in 100 parts by mass of the silicone polymer. When the rate is small, the die attach film cannot be separated easily from the adhesive sheet after irradiation with radiation ray, leading to deterioration in the pick-up efficiency of semiconductor chips. When the rate is too large, it is not possible to suppress stain on the adhesive surface by bleeding out, leading to facile generation of bonding defects, when semiconductor chips carrying the die attach film bonded thereto are mounted on a lead frame and heated.

Additives such as softeners, aging inhibitors, fillers, ultraviolet absorbents, and photostabilizers may be added to the adhesive in the range that does not affect other raw materials.

The thickness of the adhesive layer is preferably 3 μm or more and 100 μm or less, particularly preferably 5 μm or more and 20 μm or less.

<Die Attach Film>

The die attach film used in the multilayer adhesive sheet is obtained by molding an adhesive in the film shape. The specific composition constituting the die attach film may be an acrylic ester copolymer, polyamide, polyethylene, polysulfone, an epoxy resin, polyimide, polyamide acid, a silicone resin, a phenol resin, a rubber, a fluorine rubber, a fluoroplastic resin, or the mixture, copolymer, or laminated film thereof. The composition constituting the die attach film preferably contains an acrylic ester copolymer, from a viewpoint of reliability in adhesiveness to chips. The composition may additionally contain photopolymerization initiators, antistatic agents, crosslinking agents, crosslinking accelerators, fillers, and other, as they are added.

<Manufacturing Method for Multilayer Adhesive Sheet>

The multilayer adhesive sheet can be produced by first preparing an adhesive sheet by coating an adhesive on a base film and then bonding a die attach film on the adhesive-coated surface of the adhesive sheet. It can also be produced by coating and drying arbitrarily an adhesive on a separator film such as of polyethylene terephthalate, laminating it on a base film, giving an adhesive sheet, and then bonding a die attach film on the area exposed after removal of the separator film.

The bonding strength between the die attach film and the adhesive sheet is preferably 0.05 to 1.5 N/20 mm, because excessively large bonding strength gives rise to pick-up defects, while excessively small bonding strength leads to deterioration in chip-holding efficiency. When the adhesive constituting the adhesive layer of the adhesive sheet has the specific composition described above, it is possible to obtain favorable bonding strength, even when an acrylic ester copolymer is used for the die attach film.

[Method for Manufacturing Electronic Components]

The method for manufacturing electronic components using the multilayer adhesive sheet described above comprises the following steps:
(1) a step of bonding and fixing a multilayer adhesive sheet on a silicon wafer and a ring frame;
(2) a step of dicing the die attach film together with the silicon wafer with a dicing blade into semiconductor chips; and
(3) a step of picking up the semiconductor chips carrying the die attach film bonded thereto from the adhesive layer after irradiation at least of ultraviolet or radiation ray.

As described above, because the multilayer adhesive sheet is superior in semiconductor chip-holding efficiency, pick-up efficiency, and stain resistance, it is possible to reduce chip flying in the dicing step (2) and easily separate and pick up semiconductor chips carrying the die attach film bonded thereto, from the adhesive sheet in the pick-up step (3) and additionally, because the die attach film is not stained after pick-up, it has high adhesive strength to lead frame and others.

Examples

Various multilayer adhesive sheets of Examples and Comparative Examples were prepared from the base film, the adhesive layers, and the die attach films described below.

<Base Film>

The base film used was a propylene-based copolymer film (part number: X500F) produced by SunAllomer Ltd. in all Examples and Comparative Examples. The melt flow rate (MFR) of the film was 7.5 g/10 minute; the density was 0.89 g/cm$^3$; and the thickness was 80 μm.

<Adhesive Layer>

The adhesive layer was prepared by using an adhesive containing a (meth)acrylic ester copolymer (A), a ultraviolet polymerizable compound (B), a multifunctional isocyanate curing agent (C), a photopolymerization initiator (D), and a silicone polymer (E) described below.

[Adhesive]

[(Meth)acrylic Ester Copolymer (A)]

A-1: Acrylic rubber AR53L produced by Zeon Corporation; a copolymer of 40% ethyl acrylate, 23% butyl acrylate, and 37% methoxyethyl acrylate that is obtained by emulsion polymerization. None of the compounds contain any hydroxyl group.

A-2: Applicant's proprietary polymer; a copolymer of 40% ethyl acrylate, 22% butyl acrylate, 37% methoxyethyl acrylate, and 1% acrylic acid that is obtained by emulsion polymerization. None of the compounds contain any hydroxyl group.

A-3: SK Dyne 1435 produced by Soken Chemical & Engineering Co., Ltd.; a copolymer of 67% butyl acrylate, 28% methyl acrylate, and 5% 2-hydroxyethyl acrylate that is obtained by solution polymerization.

2-Hydroxyethyl acrylate has a hydroxyl group.

[Ultraviolet Polymerizable Compound (B)]

B-1: UN-905 produced by Negami Chemical Industrial Co., Ltd; B-1 comprises a urethane acrylate oligomer (B1) and a multifunctional (meth)acrylate (B2). The urethane acrylate oligomer (B1) is obtained by reacting a hydroxyl group-containing acrylate containing dipentaerythritol pentaacrylate as the principal component with an isocyanate of isophorone diisocyanate trimer. The multifunctional (meth)acrylate (B2) contains dipentaerythritol hexaacrylate as the principal component. The blending rates of both components, the urethane acrylate oligomer (B1) and the multifunctional (meth)acrylate (B2), are respectively 75% and 25%. The urethane acrylate oligomer (B1) has a weight-average molecular weight of 100000 and a polydispersity of 10.7 and the number of the vinyl groups therein is 15.

B-2: UN-3320HS produced by Negami Chemical Industrial Co., Ltd; B-2 comprises a urethane acrylate oligomer (B1) and a multifunctional (meth)acrylate (B2). The urethane acrylate oligomer (B1) is obtained by reacting a hydroxyl group-containing acrylate containing dipentaerythritol pentaacrylate as the principal component with an isocyanate of isophorone diisocyanate trimer. The multifunctional (meth)acrylate (B2) contains dipentaerythritol hexaacrylate as the principal component. The blending rates of both components, the urethane acrylate oligomer (B1) and the multifunctional (meth)acrylate (B2), are respectively 45% and 55%. The urethane acrylate oligomer (B1) has a weight-average molecular weight of 11000 and a polydispersity of 1.2 and the number of the vinyl groups therein is 15.

B-3: Applicant's proprietary polymer A; B-3 comprises a urethane acrylate oligomer (B1) and a multifunctional (meth)acrylate (B2). The urethane acrylate oligomer (B1) is obtained by reacting a hydroxyl group-containing acrylate containing dipentaerythritol pentaacrylate as the principal component with an isocyanate of hexamethylene diisocyanate trimer. The multifunctional (meth)acrylate (B2) contains dipentaerythritol hexaacrylate as the principal component. The blending rates of both components, the urethane acrylate oligomer (B1) and the multifunctional (meth)acrylate (B2), are respectively 45% and 55%. The urethane acrylate oligomer (B1) has a weight-average molecular weight of 70000 and a polydispersity of 1.2 and the number of the vinyl groups therein is 15.

B-4: Applicant's proprietary polymer B; B-4 comprises a urethane acrylate oligomer (B1) and a multifunctional (meth)acrylate (B2). The urethane acrylate oligomer (B1) is obtained by reacting a hydroxyl group-containing acrylate containing dipentaerythritol pentaacrylate as the principal component with an isocyanate of hexamethylene diisocyanate trimer. The multifunctional (meth)acrylate (B2) contains dipentaerythritol hexaacrylate as the principal component. The blending rates of both components, the urethane acrylate oligomer (B1) and the multifunctional (meth)acrylate (B2), are respectively 45% and 55%. The urethane acrylate oligomer (B1) has a weight-average molecular weight of 30000 and a polydispersity of 7.5 and the number of the vinyl groups therein is 15.

B-5: Applicant's proprietary polymer C; B-5 comprises a urethane acrylate oligomer (B1) and a multifunctional (meth)acrylate (B2). The urethane acrylate oligomer (B1) is obtained by reacting a hydroxyl group-containing acrylate containing pentaerythritol triacrylate as the principal component and an isocyanate of hexamethylene diisocyanate trimer. The multifunctional (meth)acrylate (B2) contains pentaerythritol tetraacrylate as the principal component. The blending rates of both components, the urethane acrylate oligomer (B1) and the multifunctional (meth) acrylate (B2), are respectively 45% and 55%. The urethane acrylate oligomer (B1) has a weight-verage molecular weight of 70000 and a polydispersity of 8.2 and the number of the vinyl groups therein is 6.

[Multifunctional Isocyanate Curing Agent (C)]

C-1: Coronate L-45E produced by Nippon Polyurethane Industry Co., Ltd.; trimethylolpropane adduct of 2,4-tolylene diisocyanate.

[Photopolymerization Initiator (D)]

D-1: Irgacure 127 produced by Ciba Japan K.K.; 2-hydroxy-1-(4-[4-(2-hydroxy-2-methyl-propionyl)-benzyl]-phenyl)-2-methyl-propan-1-one. It contains hydroxyl groups.

D-2: Irgacure 184 produced by Ciba Japan K.K.; 1-hydroxy-cyclohexyl-phenyl-ketone. It contains a hydroxyl group.

D-3: Irgacure 651 produced by Ciba Japan K.K.; benzyl dimethyl ketal. It contains no hydroxyl group.

[Silicone Polymer (E)]

E-1: UTMM-LS2 produced by Soken Chemical & Engineering Co., Ltd; a silicone-based graft copolymer containing silicone-based oligomer units having (meth)acryloyl groups at the silicone chain terminals and also acrylic vinyl units such as of methyl methacrylate polymerized thereto. It contains hydroxyl groups.

E-2: Silicone oil, a commercial product. It contains no hydroxyl group.

The molecular weight of the urethane acrylate oligomer (B1) contained in the ultraviolet polymerizable compound (B) was determined under the GPC measurement condition described below.

Apparatus: HLC-81 GPC (manufactured by Tosoh Corporation)
Column: one TSK Guard HZ-L column and three HZM-N columns connected in series
Temperature: 40° C.
Detection: differential refractive index
Solvent: tetrahydrofuran
Concentration: 0.2 mass/vol %
Calibration curve: The calibration curve was drawn by using polystyrene (PS) standards (produced by Varian Medical Systems, Inc.) and thus, the molecular weight was expressed as a PS-equivalent value.

<Die Attach Film>

The die attach film used was one of the followings:

1: A film mainly of an acrylic ester copolymer, thickness: 30 μm.

2: A film mainly of an epoxy-based adhesive, thickness: 30 μm.

<Preparation of Multilayer Adhesive Sheet>

An adhesive was coated on a separator film of polyethylene terephthalate to an adhesive layer thickness of 10 μm after drying. The adhesive layer was disposed on a base film and aged at 40° C. for 7 days, to give an adhesive sheet carrying the separator film. The separator film was then removed and a die attach film cut in a circular form having a diameter of 8.2 inches was laminated on the exposed adhesive layer, to give a multilayer adhesive sheet.

<Evaluation of Multilayer Adhesive Sheet>

A silicon wafer was fixed and diced on the multilayer adhesive sheet obtained in the following steps (1) to (3) and the semiconductor chips obtained were picked up. The chip-holding efficiency, the pick-up efficiency and the stain resistance during the operation were evaluated.

(1) Bonding step: A silicon wafer in the size of 8 inch diameter×0.1 mm thickness carrying a dummy circuit pattern and a ring frame were bonded and fixed on the adhesive layer of the multilayer adhesive sheet.

(2) Dicing step: The silicon wafer was cut together with the die attach film of the multilayer adhesive sheet into semiconductor chips in the size of 9 mm×9 mm by using a dicing blade. The dicing step was carried out by using the apparatus and under the conditions shown below:

Dicing apparatus: DAD341 manufactured by DISCO Corporation
Dicing blade: NBC-ZH2050-27HEEE manufactured by DISCO Corporation
Shape of dicing blade: external diameter: 55.56 mm, blade width: 35 μm, inner diameter: 19.05 mm
Dicing blade-rotating speed: 40,000 rpm
Dicing blade-advancing speed: 50 mm/second
Cut depth into adhesive sheet: 15 μm
Cutting water temperature: 25° C.
Amount of cutting water: 1.0 L/min (3) Pick-up step: After the adhesive power of the adhesive layer was reduced by irradiation with ultraviolet ray, semiconductor chips carrying the die attach film bonded thereto were separated and picked up from the adhesive layer. The pick-up step was carried out by using the apparatus and under the condition described below:

Pickup apparatus: CAP-300II manufactured by Canon Machinery Inc.
Needle pin shape: 250 μm R
Needle pin push-up height: 0.5 mm
Expansion: 8 mm <Chip-Holding Efficiency>

The chip-holding efficiency was evaluated by determining the rate of the semiconductor chips that remained held by adhesive sheet even after the dicing step.

A (favorable): chip flying rate: <5%
B (good): chip flying rate: ≥5% and <10%
C (unfavorable): chip flying rate: ≥10%

<Pick-Up Efficiency>

The pick-up efficiency was evaluated by counting the rate of the chips that could be picked up in the pick-up step.

A (favorable): 95% or more of the chips were picked up.
B (good): 80% or more and less than 95% of the chips were picked up.
C (unfavorable): Less than 80% of the chips were picked up.

<Stain Resistance>

The stain resistance was evaluated by bonding a die attach film to the adhesive layer of an adhesive sheet, storing the laminate for one week, irradiating the laminate with ultraviolet ray at an intensity of 500 mJ/cm$^2$ with a high-pressure mercury lamp, separating the die attach film from the adhesive sheet after storage for one or four weeks after irradiation, examining the die attach film by GC-MS analysis, and detecting peaks derived from the adhesive component.

A (favorable): No peak derived from the adhesive component was observed in any of the die attach films separated from the adhesive sheet after storage for one and four weeks after irradiation with ultraviolet ray.

B (good): No peak derived from the adhesive component was observed in the die attach film separated from the adhesive sheet after storage for one week after irradiation with ultraviolet ray, but peaks derived from the adhesive component were observed in the die attach film separated from the adhesive sheet after storage for four weeks after irradiation with ultraviolet ray.

C (unfavorable): Peaks derived from the adhesive component were observed in both the die attach films separated from the adhesive sheet after storage for one and four weeks after irradiation with ultraviolet ray.

The composition of the adhesive that constitutes the adhesive layer, the kind of the die attach film used, and evaluation results are summarized in Table 1. In Table 1, the values showing the composition of the adhesive that constitutes the adhesive layer are those expressed by parts by mass.

TABLE 1

| | | | | | Example | | | | | | | | |
|---|---|---|---|---|---|---|---|---|---|---|---|---|---|
| | | | | | 1 | 2 | 3 | 4 | 5 | 6 | 7 | 8 | 9 |
| Adhesive layer | (Meth)acrylic ester copolymer (A) | | | A-1 | 100 | 100 | | 100 | 100 | 100 | 100 | 100 | 100 |
| | | | | A-2 | | | | | | | | | |
| | | | | A-3 | | | 100 | | | | | | |
| | Ultraviolet polymerizable compound (B) | Urethane acrylate oligomer (B1) | | | | | | | | | | | |
| | | Weight-average molecular weight | Polydispersity | Number of vinyl groups | | | | | | | | | |
| | | B-1 100000 | 10.7 | 15 | 50 | 50 | 50 | 5 | 200 | 50 | 50 | 50 | 50 |
| | | B-2 11000 | 1.2 | 15 | | | | | | | | | |
| | | B-3 70000 | 1.2 | 15 | | | | | | | | | |
| | | B-4 30000 | 7.5 | 15 | | | | | | | | | |
| | | B-5 70000 | 8.2 | 6 | | | | | | | | | |
| | Multifunctional isocyanate curing agent (C) | | | C-1 | 5 | 5 | 5 | 5 | 5 | 0.5 | 20 | 5 | 5 |
| | Photopolymerization initiator (D) | | | D-1 | 2 | 2 | 2 | 0.8 | 8 | 2 | 2 | 0.1 | 20 |
| | | | | D-2 | | | | | | | | | |
| | | | | D-3 | | | | | | | | | |
| | Silicone polymer (E) | | | E-1 | 1.5 | 1.5 | 1.5 | 1.5 | 1.5 | 1.5 | 1.5 | 1.5 | 1.5 |
| | | | | E-2 | | | | | | | | | |
| | Die attach film 1 | | | | 1 | 2 | 1 | 1 | 1 | 1 | 1 | 1 | 1 |
| Evaluation | Chip-holding efficiency | | | | A | A | A | A | A | A | B | A | A |
| | Pick-up efficiency | | | | A | B | B | A | A | B | A | A | A |
| | Stain resistance | | | | A | A | A | A | A | A | B | B | A |
| | Over-all evaluation | | | | A | B | B | A | A | B | B | A | A |

| | | | | | Example | | | Comparative Example | | | | | |
|---|---|---|---|---|---|---|---|---|---|---|---|---|---|
| | | | | | 10 | 11 | 12 | 1 | 2 | 3 | 4 | 5 | 6 |
| Adhesive layer | (Meth)acrylic ester copolymer (A) | | | A-1 | 100 | 100 | 100 | | 100 | 100 | 100 | 100 | 100 |
| | | | | A-2 | | | | | | | | | |
| | | | | A-3 | | | | 100 | | | | | |
| | Ultraviolet polymerizable compound (B) | Urethane acrylate oligomer (B1) | | | | | | | | | | | |
| | | Weight-average molecular weight | Polydispersity | Number of vinyl groups | | | | | | | | | |
| | | B-1 100000 | 10.7 | 15 | 50 | 50 | 50 | 50 | 2.5 | 250 | | | |
| | | B-2 11000 | 1.2 | 15 | | | | | | | 50 | | |
| | | B-3 70000 | 1.2 | 15 | | | | | | | | 50 | |
| | | B-4 30000 | 7.5 | 15 | | | | | | | | | 50 |
| | | B-5 70000 | 8.2 | 6 | | | | | | | | | |
| | Multifunctional isocyanate curing agent (C) | | | C-1 | 5 | 5 | 5 | 5 | 5 | 5 | 5 | 5 | 5 |
| | Photopolymerization initiator (D) | | | D-1 | | | 2 | 2 | 2 | 0.4 | 10 | 2 | 2 | 2 |
| | | | | D-2 | 2 | | | | | | | | |
| | | | | D-3 | | | | | | | | | |
| | Silicone polymer (E) | | | E-1 | 1.5 | 0.1 | 20 | 1.5 | 1.5 | 1.5 | 1.5 | 1.5 | 1.5 |
| | | | | E-2 | | | | | | | | | |
| | Die attach film 1 | | | | 1 | 1 | 1 | 1 | 1 | 1 | 1 | 1 | 1 |
| Evaluation | Chip-holding efficiency | | | | A | A | A | A | B | A | A | A | A |
| | Pick-up efficiency | | | | A | A | A | C | C | C | C | C | C |
| | Stain resistance | | | | B | A | A | A | A | C | A | A | B |
| | Over-all evaluation | | | | B | A | A | C | C | C | C | C | C |

| | | | | | Comparative Example | | | | | | | | |
|---|---|---|---|---|---|---|---|---|---|---|---|---|---|
| | | | | | 7 | 8 | 9 | 10 | 11 | 12 | 13 | 14 | 15 |
| Adhesive layer | (Meth)acrylic ester copolymer (A) | | | A-1 | 100 | 100 | 100 | 100 | 100 | 100 | 100 | 100 | |
| | | | | A-2 | | | | | | | | | |
| | | | | A-3 | | | | | | | | | |
| | Ultraviolet polymerizable compound (B) | Urethane acrylate oligomer (B1) | | | | | | | | | | | |
| | | Weight-average molecular weight | Polydispersity | Number of vinyl groups | | | | | | | | | |
| | | B-1 100000 | 10.7 | 15 | 50 | 50 | 50 | 50 | 50 | 50 | 50 | 50 | |
| | | B-2 11000 | 1.2 | 15 | | | | | | | | | |
| | | B-3 70000 | 1.2 | 15 | | | | | | | | | |

TABLE 1-continued

| | | | | | | | | | | | | |
|---|---|---|---|---|---|---|---|---|---|---|---|---|
| | B-4 | 30000 | 7.5 | 15 | | | | | | | | |
| | B-5 | 70000 | 8.2 | 6 | 50 | | | | | | | |
| Multifunctional isocyanate curing agent (C) | C-1 | | | | 5 | 0.1 | 25 | 5 | 5 | 5 | 5 | 5 | 5 |
| Photopolymerization initiator (D) | D-1 | | | | 2 | 2 | 2 | 0.01 | 25 | | 2 | 2 | 2 |
| | D-2 | | | | | | | | | | | | |
| | D-3 | | | | | | | | | 2 | | | |
| Silicone polymer (E) | E-1 | | | | 1.5 | 1.5 | 1.5 | 1.5 | 1.5 | 1.5 | 0.01 | 25 | |
| | E-2 | | | | | | | | | | | | 1.5 |
| Die attach film 1 | | | | | 1 | 1 | 1 | 1 | 1 | 1 | 1 | 1 | 1 |
| Evaluation | Chip-holding efficiency | | | | B | A | C | A | B | A | A | C | B |
| | Pick-up efficiency | | | | C | C | A | C | A | A | C | A | B |
| | Stain resistance | | | | B | C | A | A | C | C | A | C | C |
| | Over-all evaluation | | | | C | C | C | C | C | C | C | C | C |

As shown in Table 1, it is possible, when the adhesive that constitutes the adhesive layer of the adhesive sheet has a particular composition, to obtain a multilayer adhesive sheet that permits easy separation of the die attach film from the adhesive sheet during pick up and is superior in semiconductor chip pick-up efficiency and stain resistance of the die attach film, even when an acrylic ester copolymer is used for the die attach film.

The invention claimed is:

1. A multilayer adhesive sheet comprising a base film, an adhesive layer that is disposed on one surface of the base film, and a die attach film that is disposed on the exposed surface of the adhesive layer, the adhesive that constitutes the adhesive layer containing (A) a (meth)acrylic ester copolymer, (B) an ultraviolet polymerizable compound, (C) a multifunctional isocyanate curing agent, (D) a photopolymerization initiator, and (E) a silicone polymer, wherein:
the (meth)acrylic ester copolymer (A) is a copolymer of (meth)acrylic ester monomers or a copolymer of (meth)acrylic ester monomers and vinyl compound monomers, the (meth)acrylic ester monomers and the vinyl compound monomers having no hydroxyl group;
the ultraviolet polymerizable compound (B) comprises a urethane acrylate oligomer (B1) and a multifunctional (meth)acrylate (B2), the urethane acrylate oligomer (B1) containing 10 or more vinyl groups and having a weight-average molecular weight Mw of 50000 or more and a polydispersity Mw/Mn, a ratio of the weight-average molecular weight Mw to the number-average molecular weight Mn, of 5 or more;
the photopolymerization initiator (D) has a hydroxyl group;
the silicone polymer (E) has a hydroxyl group; and
the adhesive that constitutes the adhesive layer contains 100 parts by mass of the (meth)acrylic ester copolymer (A), 5 to 200 parts by mass of the ultraviolet polymerizable compound (B), 0.5 to 20 parts by mass of the multifunctional isocyanate curing agent (C), 0.1 to 20 parts by mass of the photopolymerization initiator (D), and 0.1 to 20 parts by mass of the silicone polymer (E).

2. The multilayer adhesive sheet according to claim 1, wherein:
the urethane acrylate oligomer (B1) is a reaction product obtained by reacting a hydroxyl group-containing acrylate containing dipentaerythritol pentaacrylate as the principal component with an isocyanate of isophorone diisocyanate trimer; and
the multifunctional (meth)acrylate (B2) is dipentaerythritol hexaacrylate.

3. The multilayer adhesive sheet according to claim 1, wherein the composition constituting the die attach film contains an acrylic ester copolymer.

4. A method for manufacturing electronic components, comprising:
a bonding step of bonding and fixing a multilayer adhesive sheet to a silicon wafer and a ring frame using a multilayer adhesive sheet wherein the multilayer adhesive sheet comprises a base film, an adhesive layer that is disposed on one surface of the base film, and a die attach film that is disposed on the exposed surface of the adhesive layer, the adhesive that constitutes the adhesive layer containing (A) a (meth)acrylic ester copolymer, (B) an ultraviolet polymerizable compound, (C) a multifunctional isocyanate curing agent, (D) a photopolymerization initiator, and (E) a silicone polymer, wherein: the (meth)acrylic ester copolymer (A) is a copolymer of (meth)acrylic ester monomers or a copolymer of (meth)acrylic ester monomers and vinyl compound monomers, the (meth)acrylic ester monomers and the vinyl compound monomers having no hydroxyl group; the ultraviolet polymerizable compound (B) comprises a urethane acrylate oligomer (B1) and a multifunctional (meth)acrylate (B2), the urethane acrylate oligomer (B1) containing 10 or more vinyl groups and having a weight-average molecular weight Mw of 50000 or more and a polydispersity Mw/Mn, a ratio of the weight-average molecular weight Mw to the number-average molecular weight Mn, of 5 or more; the photopolymerization initiator (D) has a hydroxyl group; the silicone polymer (E) has a hydroxyl group; and the adhesive that constitutes the adhesive layer contains 100 parts by mass of the (meth)acrylic ester copolymer (A), 5 to 200 parts by mass of the ultraviolet polymerizable compound (B), 0.5 to 20 parts by mass of the multifunctional isocyanate curing agent (C), 0.1 to 20 parts by mass of the photopolymerization initiator (D), and 0.1 to 20 parts by mass of the silicone polymer (E);
a dicing step of dicing the silicon wafer into semiconductor chips with a dicing blade; and
a pick-up step of irradiating the semiconductor chip at least with ultraviolet ray or radiation ray and picking UP the chips and the die attach films from the adhesive layer.

* * * * *